United States Patent [19]

Saka et al.

[11] Patent Number: 5,598,627

[45] Date of Patent: Feb. 4, 1997

[54] METHOD OF MAKING A WIRE HARNESS

[75] Inventors: Kazuhito Saka; Masayoshi Hashimoto; Kou Furuta; Takahiro Okamura, all of Mie-ken, Japan

[73] Assignee: Sumitomo Wiring Systems, Ltd., Yokkaichi, Japan

[21] Appl. No.: 471,168

[22] Filed: Jun. 6, 1995

Related U.S. Application Data

[63] Continuation of Ser. No. 971,991, Oct. 27, 1992.

[30] Foreign Application Priority Data

Oct. 29, 1991 [JP] Japan ..................................... 3-309814
Mar. 31, 1992 [JP] Japan ..................................... 4-27966

[51] Int. Cl.⁶ ........................................................ H01R 43/04
[52] U.S. Cl. ............................. 29/861; 439/67; 174/72 A; 174/88 R; 29/825
[58] Field of Search ............................ 29/825, 842, 843, 29/861; 174/72 A, 72 R, 88 R; 361/749, 826; 439/67, 77

[56] References Cited

U.S. PATENT DOCUMENTS

| 4,113,981 | 9/1978 | Fujita et al. | 174/88 R |
| 4,129,939 | 12/1978 | Baldyga | 29/625 |
| 4,157,612 | 6/1979 | Rainal | 174/117 F X |
| 4,486,619 | 12/1984 | Trine et al. | 174/117 F X |
| 4,731,503 | 3/1988 | Kitanishi | 174/88 R |
| 4,917,613 | 4/1990 | Kabadi | 439/67 |
| 4,955,814 | 9/1990 | Christie et al. | 439/77 |
| 4,974,121 | 11/1990 | Masuko et al. | 361/749 |
| 5,008,656 | 4/1991 | Cheriff et al. | 340/718 |

FOREIGN PATENT DOCUMENTS

| 0213859 | 8/1986 | European Pat. Off. |
| 61-148706 | 7/1986 | Japan. |

Primary Examiner—P. W. Echols
Assistant Examiner—Adrian L. Coley
Attorney, Agent, or Firm—Sughrue, Mion, Zinn, Macpeak & Seas

[57] ABSTRACT

A wire harness includes a main circuit part 1 including an insulated conductor wiring circuit plate 3 in which conductors 8 are arranged on a base insulation film 9 to form a wiring circuit by turning, bowing, crossing, or branching the conductors and covered with a flexible insulation film 12. Further, a branched connection part 2 is provided including a printed circuit plate 4 connected to a connecting area 14A in the main circuit part 1 through a connecting area 14B formed thereon and adapted to receive leading electrical wires 5. The conductor wiring circuit plate 30 is a flexible circuit plate which has an insulation base film 33, conductors 31 juxtaposed on the base film, an upper coverlet film 32, and a connecting area 36 for the conductors 31 having an adhesive layer 37 on the back side of the film 32. The connecting area 36 is formed by removing a predetermined width 38 of the base film 33 along the lateral direction of the coverlet film 32.

3 Claims, 9 Drawing Sheets

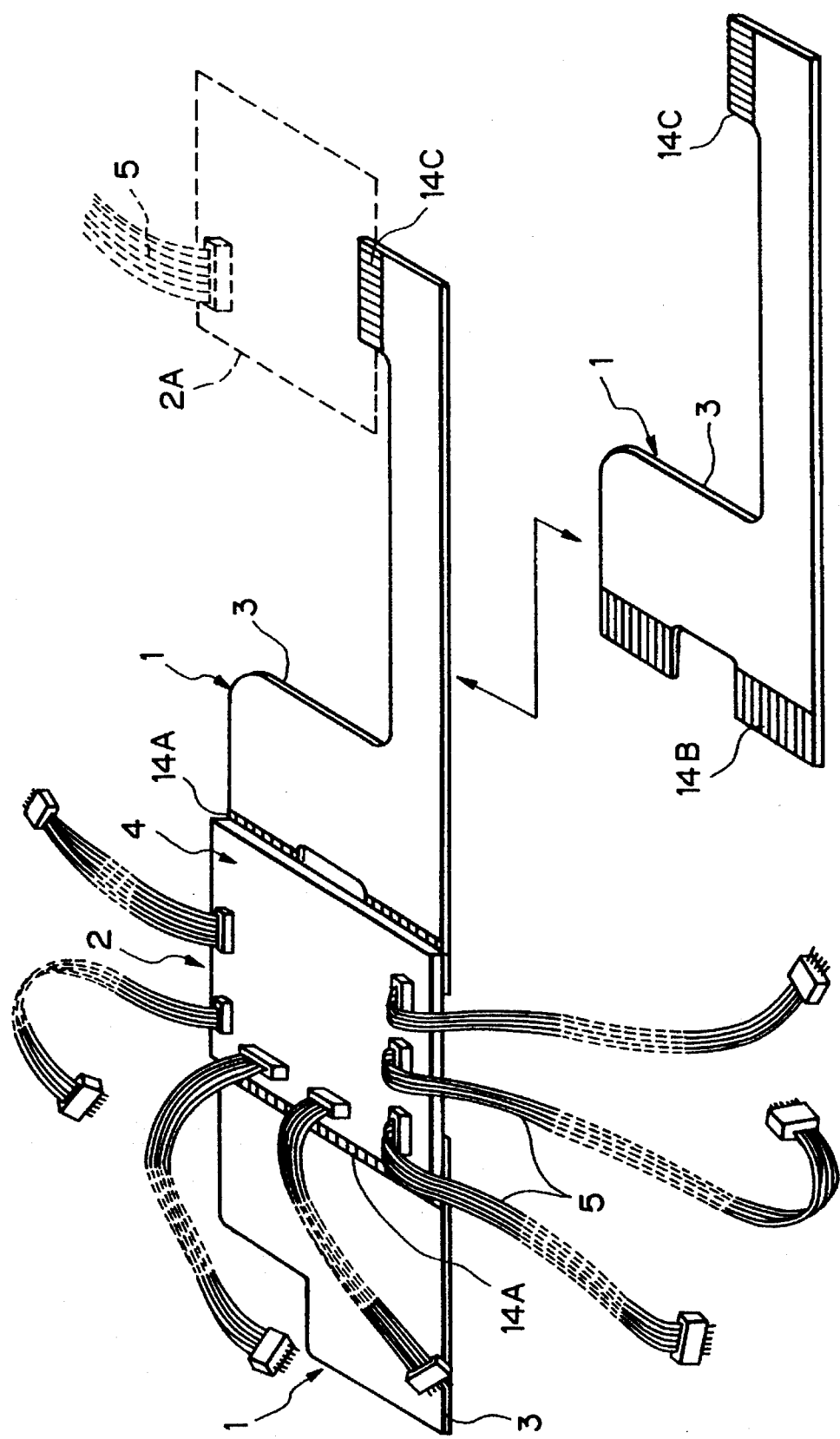

METHOD OF MAKING A WIRE HARNESS

This is a continuation of application Ser. No. 07/971,991 filed Oct. 27, 1992.

BACKGROUND OF THE INVENTION

1. Field of the Invention

This invention relates to a wire harness to be used in electrical wiring for an electrical device or an office automation device such as a copier (PPC), a personal computer (PC), a facsimile device, a video tape recorder, a video camera, and the like, or in electrical wiring in an instrument panel for a motor vehicle.

2. Statement of the Prior Art

It is well known that a wire harness for electrical devices, office automation devices, or the like uses an insulated conductor wiring circuit plate or a flexible plain conductor cable (hereinafter referred to as "FPC") in which a conductor circuit is printed on a base film made of a resin film. A wire harness using the FPC has advantages of facilitating the formation of a circuit in accordance with the arrangement of connectors to be coupled, as well as of closing up and compacting the circuit.

However, since the FPC to be used in the wire harness requires an etching process, when the FPC is formed into multiple layers to make a complicated conductor circuit, it is necessary to carry out a complicated process, such as double etching, on the front and back sides. This results in high cost. Further, since there are few standard common parts among different circuits on account of the construction of the FPC, the FPC is inferior to the application of circuit alternations and the whole of the wire harness must be produced individually. This also results in high costs.

In such a wire harness, the work to connect the FPC to a printed base plate is very troublesome.

For convenience of explanation, the conventional work to connect a conventional FPC to the printed base plate will be described below by referring to FIGS. 17 to 20. FIGS. 17 and 19 are perspective views illustrating the FPC connected to the printed base plate. FIGS. 18 and 20 are cross-sectional views of the respective portions.

The FPC, as shown in FIGS. 17 and 18, is a flexible plate which has a base film 83, strip-like conductors 31 juxtaposed on the film 33, and a coverlet film 32 attached to the conductors 31. Ends or midportions of the conductors 31 are soldered to conductive paths 35 of the printed base plate or the like to be connected.

However, the work for connecting the conductors 31 to a conductive path 35 on the printed base plate 34 is troublesome and takes time, since heat in the soldering copper is transmitted to the coverlet film 32, or excess solder on the connector area causes an electrical short circuit. In order to overcome these shortcomings, Japanese Patent Public Disclosure No. 3-269912 (1991) discloses an FPC, as shown in FIG. 19, which has a connection area 36 exposing the conductors 31 by removing the coverlet film 32 and the base film 33.

Although the FPC disclosed in the above Japanese Patent Public Disclosure No. 3-269912 is easier to connect to the printed base plate 34 in comparison with the conventional FPC having coverlet film 32 on the connection area, the former FPC has the following disadvantages. As shown in FIG. 20, the connection area 36 having no coverlet film 32 or base film 38 is mounted on the printed base plate 34 which is to be connected, a clearance 42 corresponding to the thickness of the base film 33 is defined between both conductors 31 and the conductive path 35. Consequently, soldering the conductors 31 and the conductive path 35 is difficult, consumes a lot of solder and deteriorates the conductivity between the conductors, since the conductors 31 are electrically connected to each other through the solder filled in the clearance.

Further, it is necessary to reinforce the connection area 36 by taping, or to somehow prevent displacement between the conductors during soldering, in order to ensure conductivity on use, since the connection area 36 deteriorates in a mechanical resistance of tension. Accordingly, the above FPC is not suitable for a modern mass production system on account of the connecting work.

SUMMARY OF THE INVENTION

A main object of the present invention is to provide a wire harness for electrical devices, which can improve the formation of a circuit and reduce its cost.

Another object of the present invention is to provide a flexible circuit plate (FCP) for a wire harness, which can improve the quality and safety of the connection and conductivity when the FCP is electrically connected to a printed base plate.

In order to achieve the above objects, a wire harness in accordance with the present invention comprises:

a main circuit part including an insulated conductor wiring circuit plate in which conductors are arranged on a base insulation film to form a wiring circuit and covered with flexible insulation material; and a branched connection part including a printed wiring plate connected to said conductors in said main circuit part through conducting paths formed on the printed wiring plate and adapted to receive leading electrical wires.

In particular, the insulated conductor wiring circuit plate forms the desired main circuit part by using a base insulation film such as polyethylene-terephtalate (PET), polyvinyl chloride (PVC), polyimide (PI), polyphenylene sulfurid (PPS), or the like with a thickness of 10–500 μm; by using a conductor wire such as a soft copper wire, a tin-plated soft copper wire, other plated wires, a copper alloy wire, a clad wire formed by combining different metals or a stripped or sheathed cable formed by twisting a plurality of the same or different wires (for example a magnet cable) with a diameter of 0.03–1.0 mm; and by arranging them on the base insulation film in bent, turned, branched, or crossed patterns.

If stripped conductors are used, in order to insulate the exposed portion of the conductor on the insulation film, it is preferable to coat the conductor with an insulation resin, to cover it with the same film as the insulation film, or to laminate the insulation film with an adhesive resin. Thus, the upper exposed portion of the conductor is covered with the insulation material.

The printed wiring plate to be connected to the insulated conductor wiring circuit plate may be a known printed circuit plate on a hard or half hard base plate, or a known flexible printed wiring plate. The conductors of the connection areas formed on the paths are connected to the conducting paths on the printed wiring plate by mechanically connecting means, soldering or welding. The leading electrical wires made of flat parallel wires having a connector (a ribbon cord) or a usual wire are connected to the printed wiring plate by soldering a connector pin or welding. The main circuit part including the insulated conductor wiring circuit plate with the desired main circuit of the wire harness is connected to the leading electrical wires to be connected to the electrical devices through the branched connection part of the printed wiring plate. This constructs a wire harness having a desired circuit.

Since the wire harness of the present invention has a connecting construction which combines the main circuit part including the insulated conductor wiring circuit plate, and the branched connection part of the printed wiring plate including the leading wires, it is possible to simplify the circuit formation, and to compact the wire harness. Further, since it is possible to change the circuit of the wire harness by changing only the main circuit part, alternation of the circuit of the wire harness can be effected rapidly and conveniently and the branched connection part can be standardized.

In addition, the insulated conductor wiring circuit plate can be formed into a multiple layer construction without etching on a crossing array of the conductors. This improves the flexibility of formation of a high density circuit.

In order to achieve the above objects, in the flexible circuit plate (FCP) to be used in the wire harness of the present invention, the insulated conductor wiring circuit plate is a flexible circuit plate which has insulation base film, conductors juxtaposed on said base film, an upper coverlet film, and a connecting area for said conductors. The coverlet film has an adhesive layer on the back thereof. The connecting area is formed by removing a predetermined width of the base film along the lateral direction of the coverlet film.

As an alternative to the above FCP, the insulated conductor wiring circuit plate has a connecting area with exposed conductors without using the coverlet film.

Since in the FCP of the present invention the adhesive layer is disposed on the back side of the coverlet film and the connection area for the FCP has no film, exposing the back side of the conductor, there is no harmful clearance between the conductors to be connected and thus the pair of conductors are tightly contacted with each other, by imposing the connection area on the printed base plate in the FCP.

The exposed adhesive layer on the back side of the coverlet film between the juxtaposed conductors is attached to the upper surface of the printed base plate or the like so that the connecting posture of the FCP on the printed base plate is fixed. Accordingly, it is possible to inter-connect the conductors instantly simply by putting the FCP on the printed base plate, relatively positioning them and pushing them by the touch of a finger. If the FCP has exposed conductors, it is possible to position the FCP by utilizing the exposed conductors or to reinforce the connection by soldering.

BRIEF DESCRIPTION OF THE DRAWINGS

FIG. 7 is a perspective view of a wire harness of a second embodiment in accordance with the present invention;

DETAILED DESCRIPTION OF THE PREFERRED EMBODIMENTS

Referring now to FIGS. 1 to 16, an embodiment of a wire harness in accordance with the present invention will be explained below.

Figure 1:
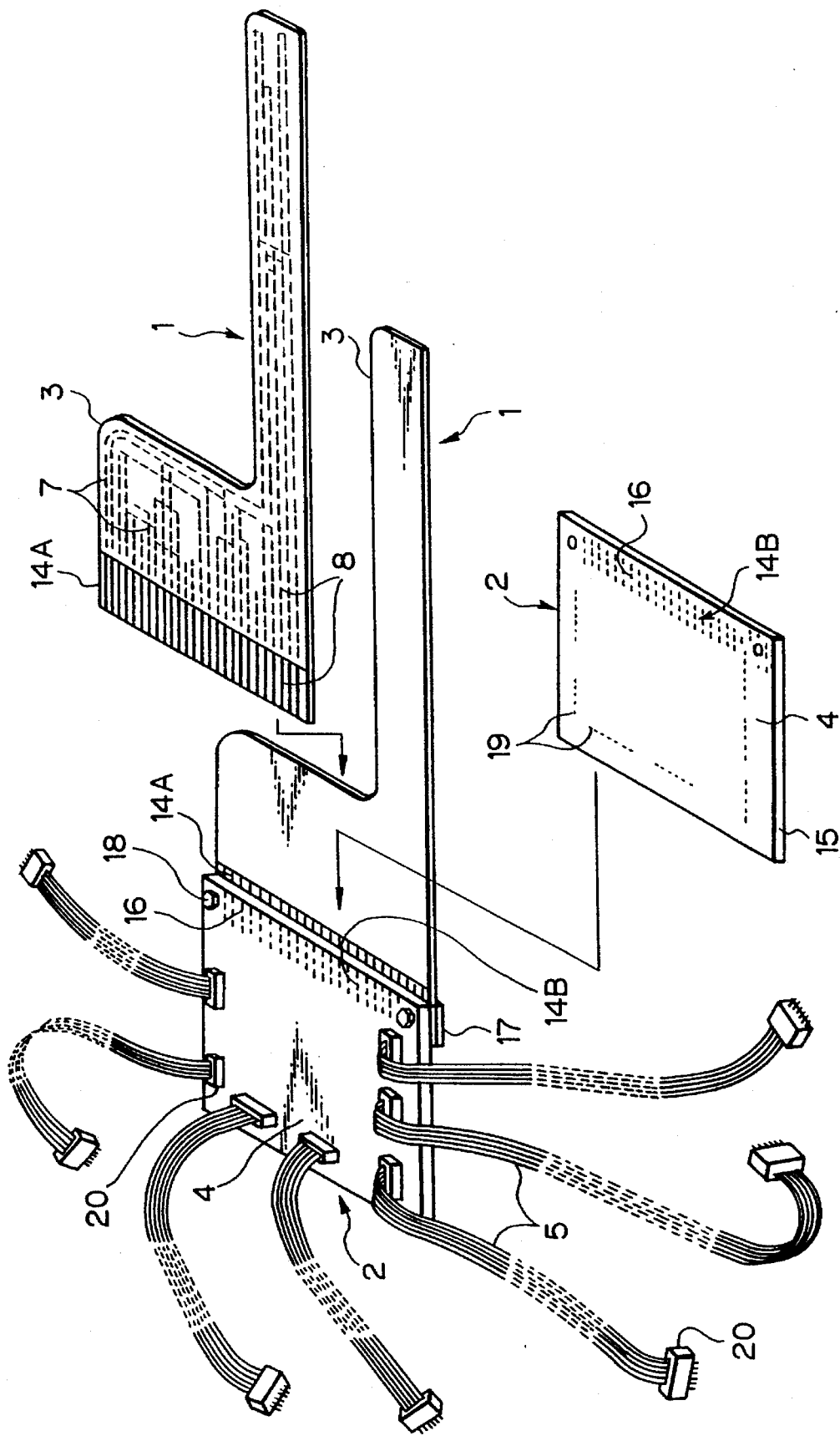
FIG. 1 is a perspective view of a wire harness of a first embodiment in accordance with the present invention.

FIG. 1 shows a first embodiment of the wire harness. The wire harness comprises a main circuit part 1 including an insulated conductor wiring circuit plate 3 on an insulation film (hereinafter referred to as "flexible circuit plate" or "FCP") and a branched connection part 2 including a printed circuit plate 4 connected to the main circuit part 1 and adapted to receive leading electrical wires 5. A main circuit 7 formed on the main circuit part 1 is connected through the branched connection part 2 to the leading electrical wires 5 which are connected to the electrical devices.

Figure 2:
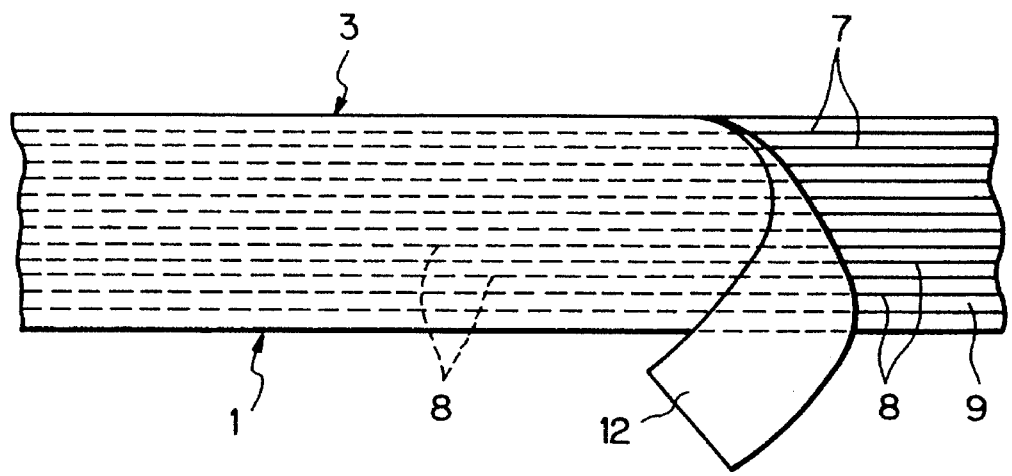
FIG. 2 is a partial plan view of an insulated conductor wiring circuit plate in the embodiment shown in FIG. 1.
Figure 3:
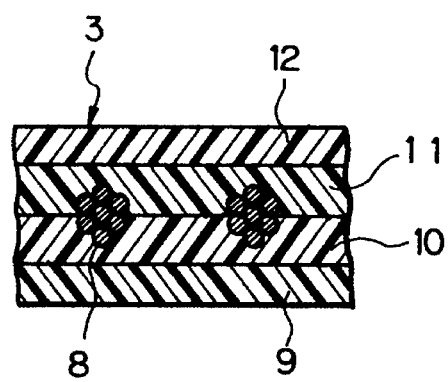
FIG. 3 is a partial cross-sectional view of the plate in the embodiment shown in FIG. 1.

In particular, the FCP 3, as shown in FIG. 2, has a main circuit 7 which is formed by arranging conductors 8 made of tin-plated soft copper wires with a diameter of 0.1 mm in bent, turned, or branched patterns on an insulation film 9 made of a polyethylene-terephtalate (hereinafter referred to as "PET") with a thickness of 25 µm and having an adhesive layer 10 with a thickness of 40 µm. An insulation film 12 made of a PET film with a thickness of 25 µm and having a thermoplastic adhesive layer 11 with a thickness of 40 µm is coated over the insulated conductor circuit plate 3 so that the conductors are insulated at the upper exposed portion. The piled insulation films 9, 12 are cut along the profile of the circuit formed by the conductors 8 so that the ends of the conductors 8 on one side of the insulation film 9 are closely juxtaposed and exposed to form a connection area 14A. The conductors are spaced with precise pitches of 0.5, 0.3, 1.0, 1.2 mm, etc.

Figure 5A:
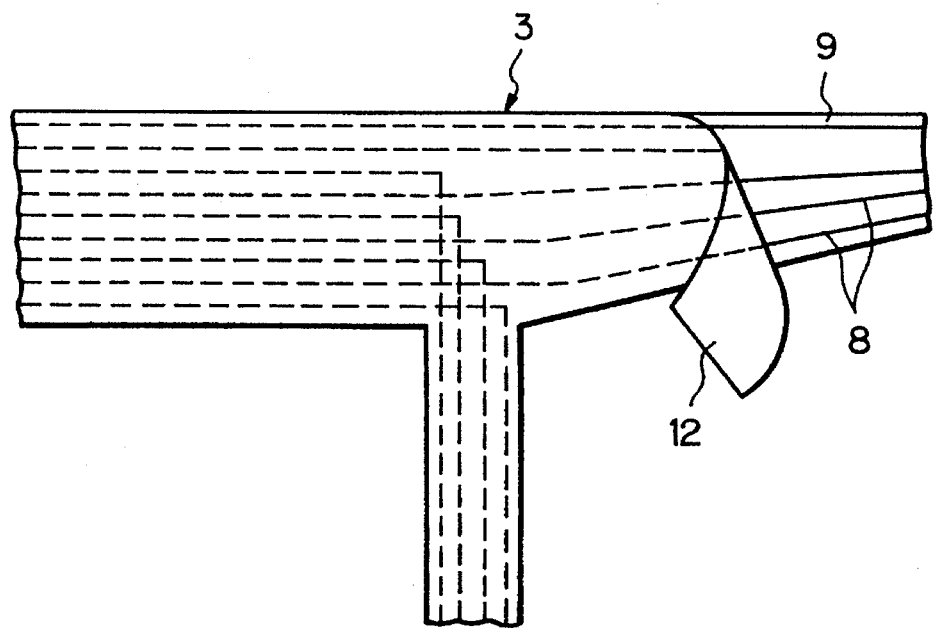
FIGS. 5A and 5B are plan views of other versions of the plate shown in FIG. 1.
Figure 5B:
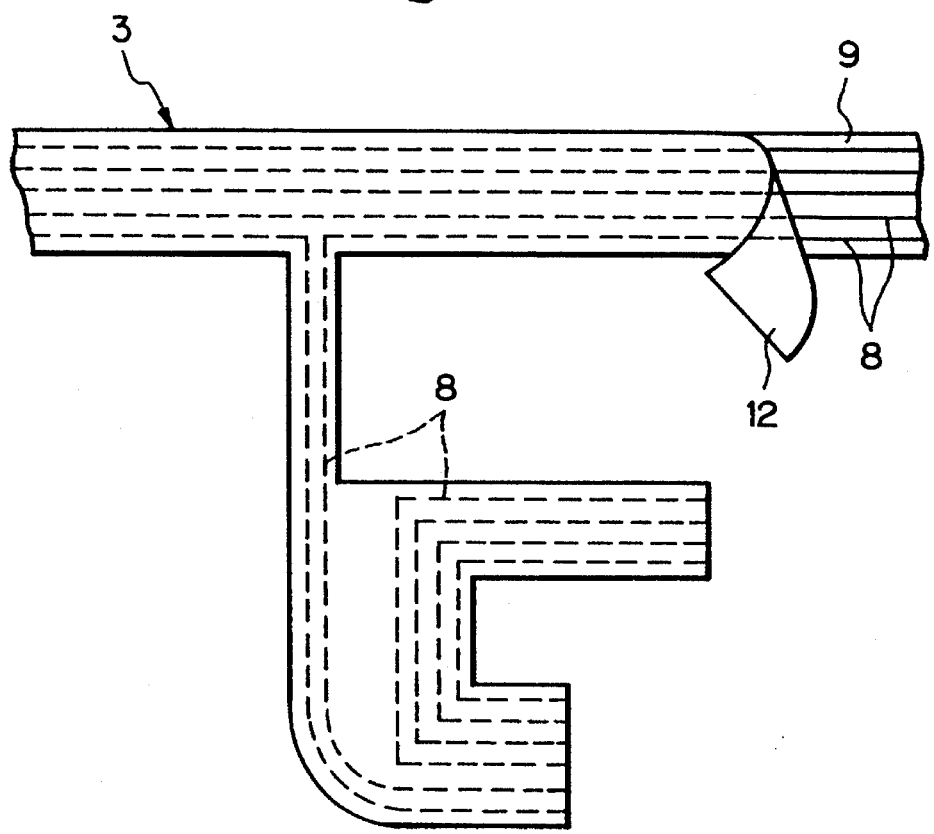
Figure 6A:
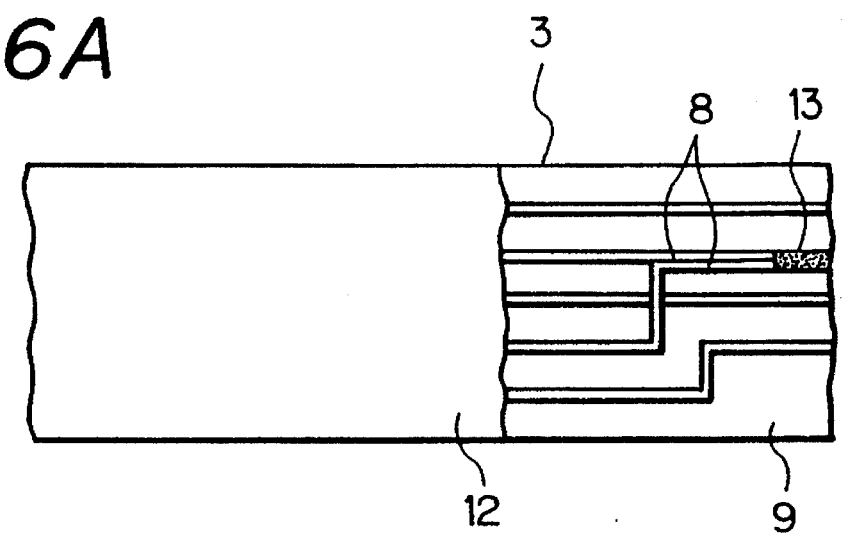
FIGS. 6A to 6D are plan views of various wiring forms of conductors In the plate shown in FIG. 1.
Figure 6B:
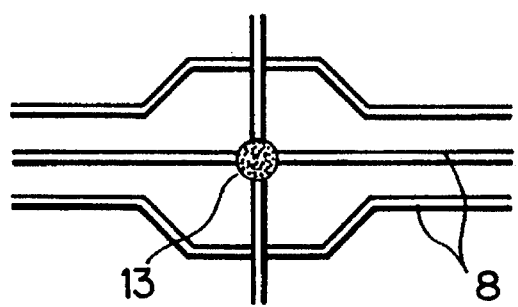
Figure 6C:
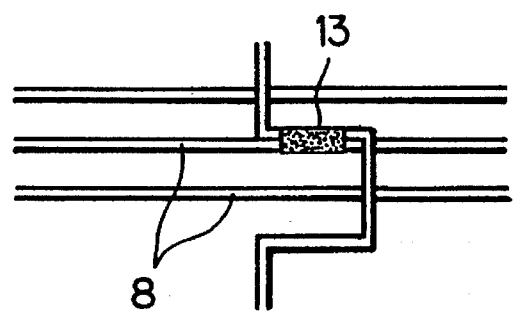
Figure 6D:
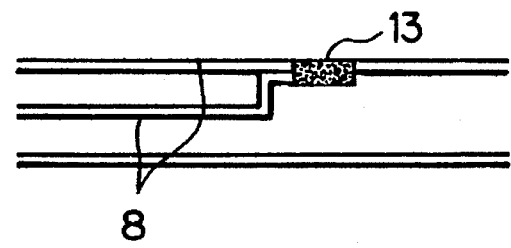

As shown in FIGS. 5A and 5B, the conductors are turned or bent on the FCP 3 In compliance with the patterns of the main circuit 7 to be formed, while the insulation film 9 is branched in accordance with the patterns. As shown in FIGS. 6A to 6D, the conductors 8 are wired on the FCP 3 to form branched portions 13, such as parallel connections (6A, 6C, 6D) or a crossing connection (6B), by soldering or welding the intermediate portions of the conductors 8.

As shown in FIG. 1, the printed wiring plate 4 in the branched connection part 2 is a square, hard base plate 15 which has a printed conductive pathe, (not shown) on the back side. A connection area 14B is formed along an end of the printed wiring plate 4 by arranging ends 16 of the conductive paths in a very small pitch. The conductors 8 are electrically connected to the ends 16 of the conductive paths by overlapping connection area 14B on connection area 14A on the FCP 3. This overlapping of areas 14A and 14B is fixed by attaching a reinforcing plate 17 to the back side of the FCP 3 and applying the printed wiring plate 4 to the front side of the FCP 3 to form a sandwich construction and securing it by bolts 18.

Figure 4:
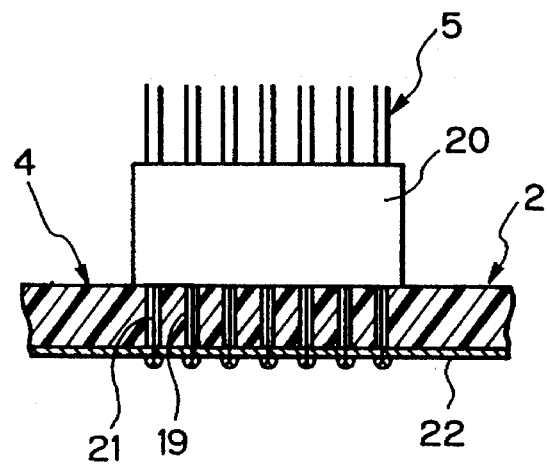
FIG. 4 is a side view of the connection between the plate and leading electrical wires in the embodiment shown in FIG. 1.

The branched connection part 2 is provided with mounting holes 19 for connector pins at given positions. As shown in FIG. 4, connector pins 21 of a connector 20 for the leading wires 5 are inserted into the holes 19 and the top ends of the connector pins 21 projecting from the back side of part 2 are soldered to conductive paths 22. The leading wires 5 in this embodiment may be a flat plate-like cable in which a plurality of fine wires are juxtaposed in a very small pitch and connected to connectors 20 at the opposite ends.

An alternative to the present embodiment will be explained below.

As shown in FIG. 7, the main circuit part 1, branched connection part 2, and leading wires 5, which constitute the main portion of the wire harness of this invention, are not limited to the above-described embodiment. For example, a single branched connection part 2 may be connected to a plurality of main circuit parts 1, a main circuit part 1 which connects a branched connection part 2 to a connection area 14A may be provided with another connection area 14C and connected to another branched connection area 2A or other leading wires, or a main circuit part 1 may be connected to the center position of a branched connection part 2 (not shown).

Figure 8:
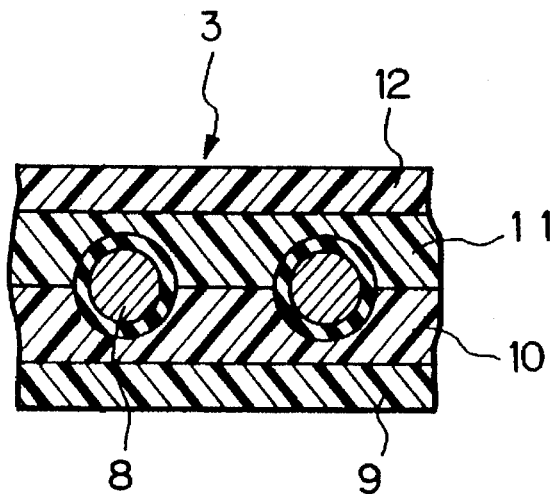
FIG. 8 is a partial cross-sectional view of an insulated conductor wiring circuit plate in the second embodiment shown in FIG. 7.

Another embodiment of the FCP or flexible circuit plate 3 is explained by referring now to FIG. 8. As shown in FIG. 8, conductors 8 made of a polyurethane-insulated magnet wire are disposed on insulation film 9 made of polyimide (PI) having an adhesive layer 10, and insulation film 12 made of polyimide (PI) having an adhesive layer 11 is coated over the conductors 8 and the film 9. Since the conductors 8 in this embodiment are insulated, it is possible to cross the conductors 8 on the same insulation film 9. Accordingly, it is possible to increase the flexibility in the circuit design of the main circuit part 1 by utilizing the crossing of the insulated conductors.

Figure 9:
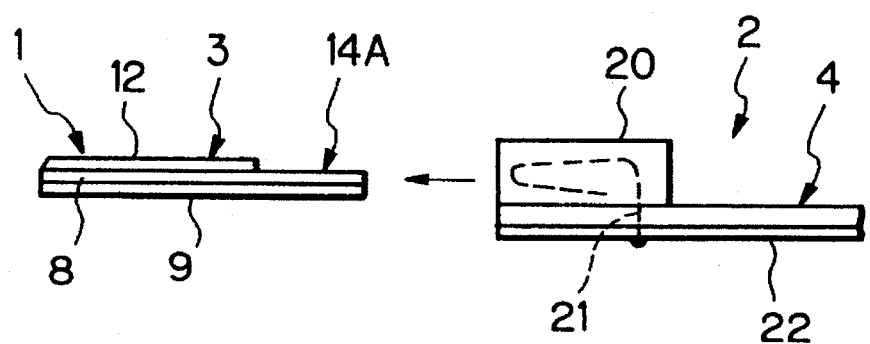
FIG. 9 is a side view of a means for coupling a printed wiring plate to the plate in the embodiment shown in FIG. 7.
Figure 10:
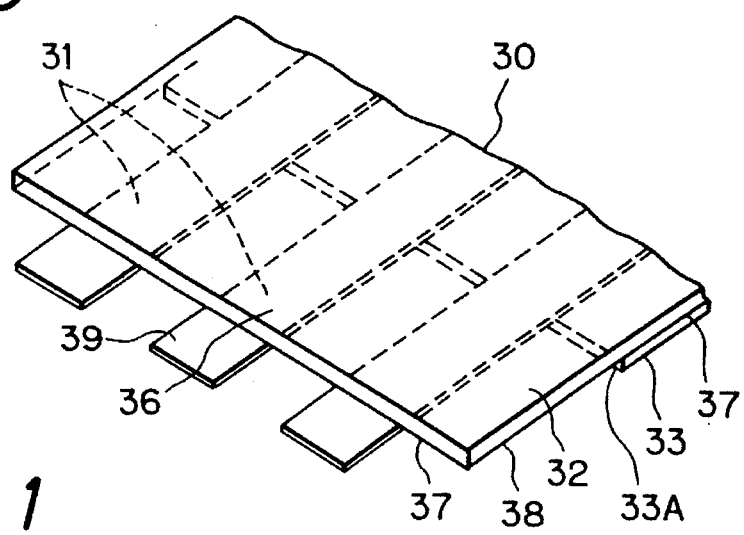
FIG. 10 is a perspective view of an FCP of a third embodiment to be used in the wire harness of the present invention.

On the other hand, means for interconnecting the main circuit part 1 and the branched connection part 2, as shown in FIG. 9, include soldering the connector pins 21 of the connector 20 secured to the upper surface of the printed wiring plate 4 to the conductive paths 22 on the back side of the plate 4 and inserting the connection area 14A of the main circuit part 1 into the connector 20; or piling the connection area 14A of the main circuit part I on the connection area 14B of the branched connection part 2 and soldering them.

Referring now to FIGS. 10 to 16, an embodiment of a work for connecting the FCP to a printed base plate in the above-described wire harness will be explained below. First, by referring to FIG. 10 which illustrates a third embodiment of this invention, an FCP or a flexible circuit plate 30 is formed by juxtaposing strip conductors 31 on a base film 33. A flexible plate is formed by putting a coverlet film 32 on the juxtaposed conductors 31 on the base film 33. The FCP 30 has a connection area 36 which connects the conductors 31 to a conductive path 35 of a printed base plate 34. An adhesive layer 37 is provided between the conductors 31 and the coverlet film 32 so that the adhesive layer 37 spreads over the entire back side of the coverlet film 32. The connection area 36 is provided with an area 38 on which the base film 33 is removed. The non-base film area 38 defines a belt-like space across the FCP 30.

Figure 11:
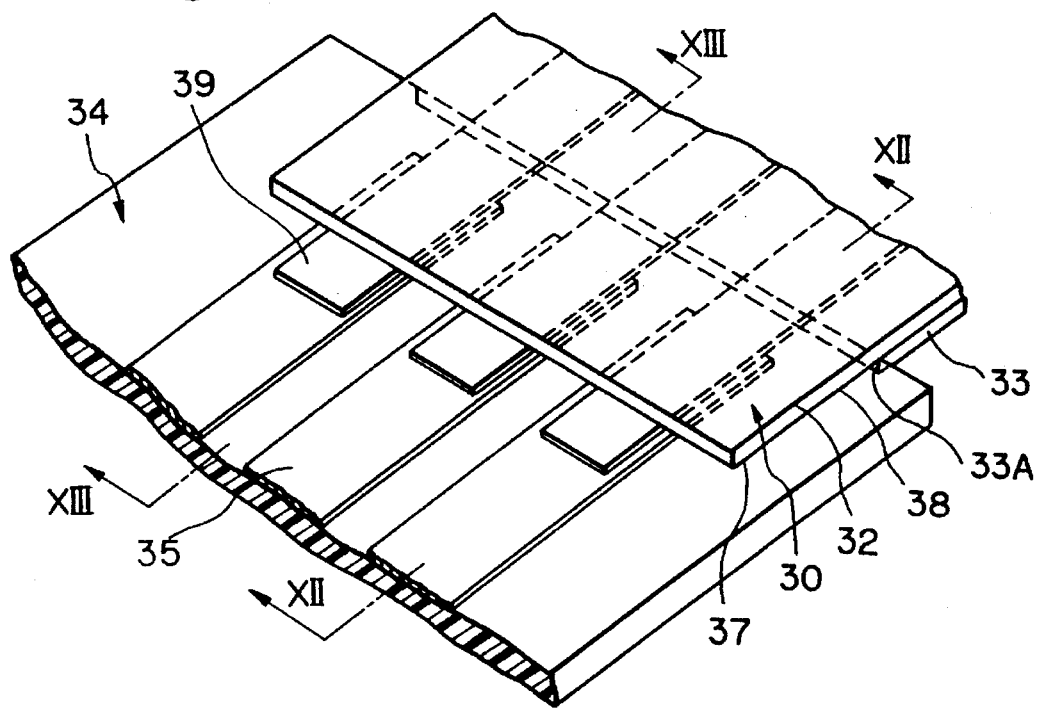
FIG. 11 is a perspective view Illustrating the connection between a connecting area of the FCP shown in FIG. 10 and a printed base plate.
Figure 12:
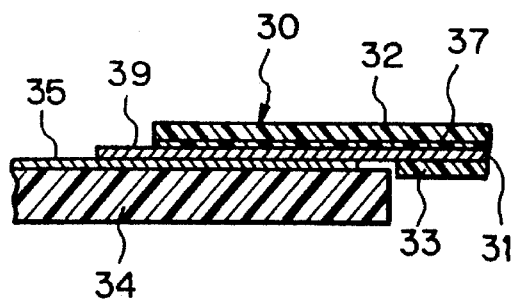
FIG. 12 is a cross-sectional view taken along lines XII—XII in FIG. 11.
Figure 13:
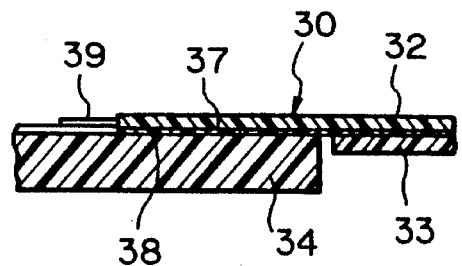
FIG. 13 is a cross-sectional view taken along lines XIII—XIII in FIG. 11.

The back side of the conductors 31 is exposed on the back side of the connection area 36. The adhesive layer 37 on the back side of the coverlet film 32 is exposed between the conductors 31. The conductors 31 are electrically contacted with the conductive paths 35 as shown in FIG. 11, by piling the connection area 36 on the printed base plate 34 and pushing them so that a front edge 33A of the base film 33 abuts on a rear edge of the printed base plate 34. As shown in FIG. 13, the adhesive layer 37 on the coverlet film 32 between the conductors 31 adheres on the printed base plate 34 to fix the posture of the FCP on the printed base plate 34. In this embodiment, the adhesive layer 37 is made of an adhesion which acts at room temperature.

The top end 39 of the conductors 31 projects from the coverlet film 32 in the connection area 36 in this embodiment so that the FCP 30 can be readily positioned on the printed base plate 34 and the conductors 31 are positively connected and soldered on the conductive paths.

Figure 14:
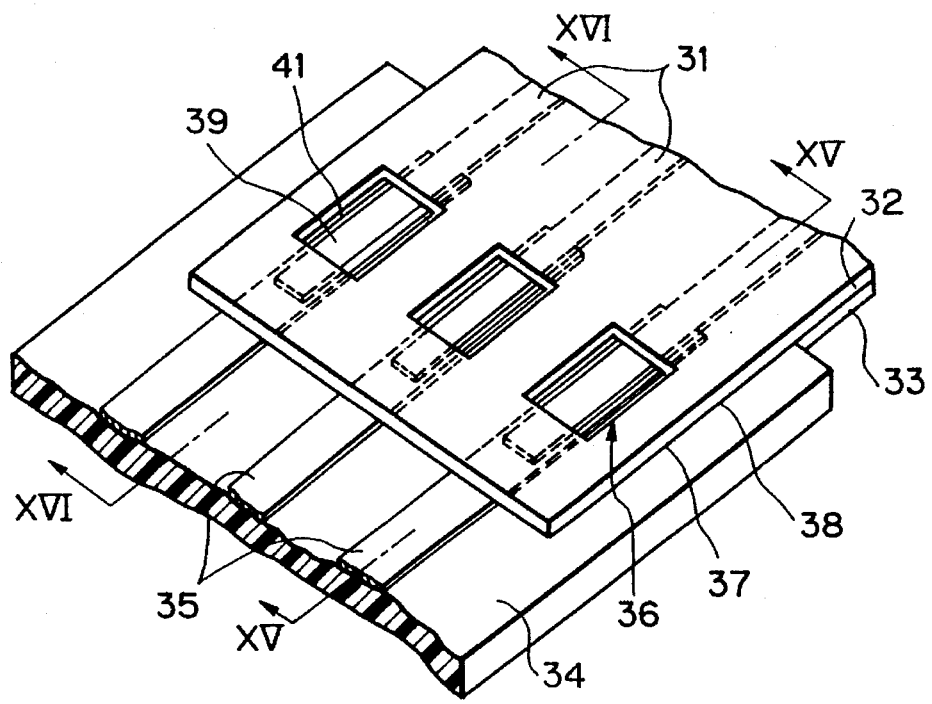
FIG. 14 is a perspective view illustrating the connection between a connecting area of an FCP of a fourth embodiment to be used in the wire harness of the present invention and a printed base plate.

FIG. 14 shows a fourth embodiment of this invention. The FCP of the fourth embodiment has the same adhesive layer 37 as that of the first embodiment shown in FIG. 1. The connection area 36 to be connected to the printed base plate 34 is provided with the same non-base film area 38 across the FCP 30 as that of the first embodiment. Windows 41 are formed at the intermediate portion so that a portion 39 of the conductors 31 is exposed in its entire width.

Figure 15:
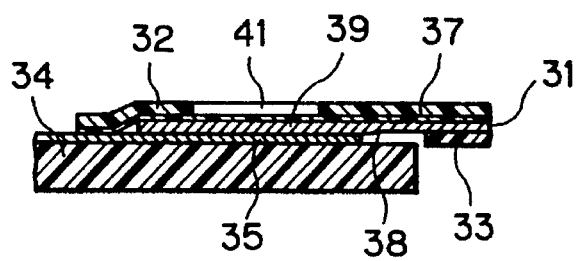
FIG. 15 is a cross-sectional view taken along lines XV—XV in FIG. 14.
Figure 16:
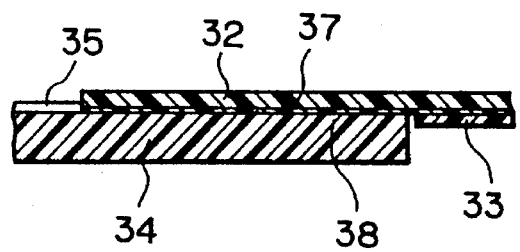
FIG. 16 is a cross-sectional view taken along lines XVI—XVI in FIG. 14.
Figure 17:
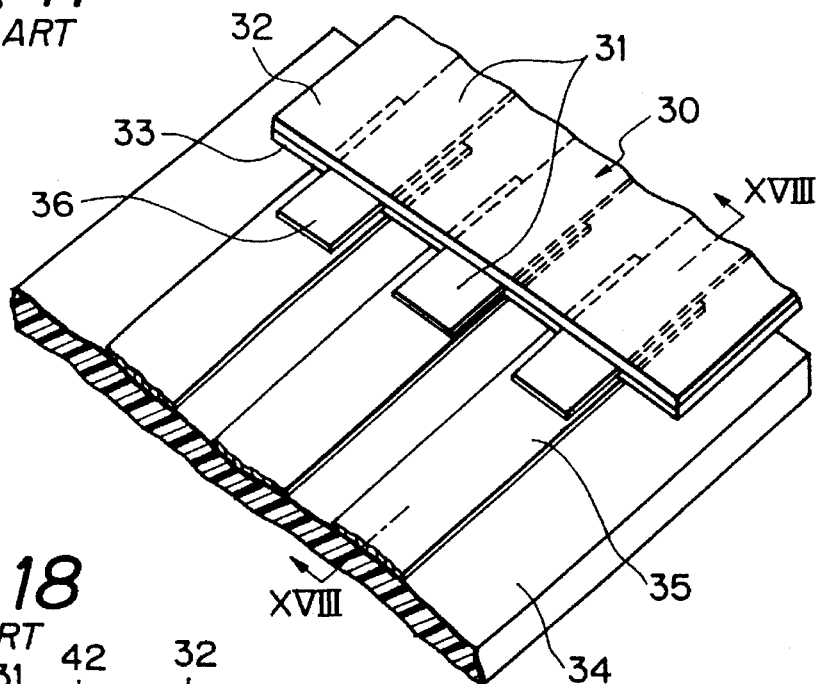
FIG. 17 is a perspective view illustrating the connection between a conventional FPC and a printed base plate.
Figure 18:
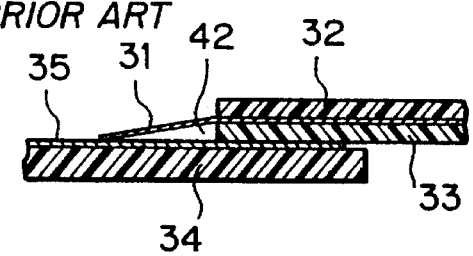
FIG. 18 is a cross-sectional view taken along lines XVIII—XVIII in FIG. 17.
Figure 19:
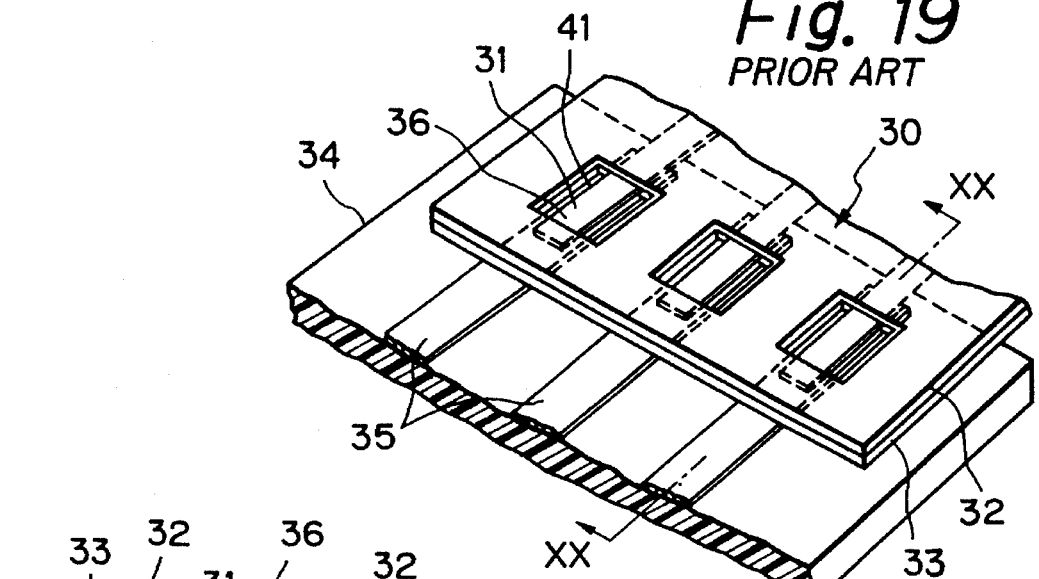
FIG. 19 is a perspective view illustrating the connection between another conventional FPC and a printed base plate.
Figure 20:
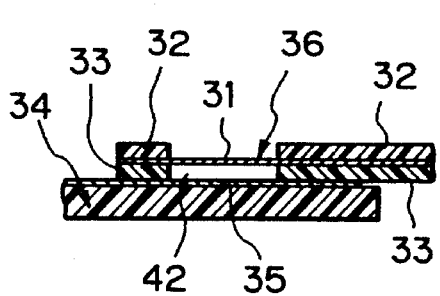
FIG. 20 is a cross-sectional view taken along lines XX—XX in FIG. 17.

In the fourth embodiment, the conductors 31 are contacted with the conductive paths as shown in FIGS. 15 and 16. The adhesive layer 37 on the connection area 36 between the conductors 31 adheres on the printed base plate 34 to fix the posture of the conductors 31 on the conductive paths.

The FCP 30 in this embodiment has high reliability in electrical conduction, since the conductors 31 of the FCP 30 are contacted with the conductive paths 35 by merely putting the connection area 36 on the printed base plate and pushing them. Further, this embodiment does not require troublesome soldering work and can improve the connecting work of the FCP. A slight soldering on the exposed conductors 39 does not require reinforcing tape and can improve the mechanical strength of the connection areas.

In the above embodiment, the adhesive layer 37 may be a thermoplastic adhesion and the exposed conductors 39 may be omitted.

As described above, in the wire harness in accordance with the present invention, it is possible to easily form the crossing and multilayering of the circuit and to eliminate the etching process, since the wire harness comprises the main circuit part, including the insulated conductor wiring circuit plate in which conductors are arranged on the base insulation film to form the wiring circuit, and the branched connection part including the printed wiring plate and the leading electrical wires. It is also possible to readily handle the alternation of the circuit in the wire harness at low cost, since only the main circuit part having the common branched connection part is freely exchanged, and it is possible to reduce the cost for forming the wire harness since the common branched connection part is mass-produced by a standard design and eliminates the etching process.

The FCP to be used in the above wire harness can improve conduction to the other elements and electrical reliability, simplify the connecting work, and reduce the cost.

What is claimed is:

1. A method of making a wire harness, comprising the steps of:

providing a main circuit part including an insulated conductor wiring circuit plate in which conductors are arranged on a base insulation film to form a wiring circuit, wherein the step of providing the main circuit part further includes forming the wiring circuit of said insulated conductor wiring circuit plate by turning, bending, crossing or branching said conductors;

covering said base insulation film and said conductors of the insulated conductor wiring circuit plate with a flexible insulation material;

removing the flexible insulation material along only a terminal edge of said insulated conductor wiring circuit plate while said base insulation film remains, so that ends of said conductors are exposed above said base insulation film located thereunder to form a connection area having a predetermined width, said connection area being devoid of said flexible insulation material thereby leaving a belt-shaped space across the terminal edge of said insulated conductor wiring circuit plate;

providing a branched connection part including a printed wiring plate having conductive paths;

forming a connection area along an edge portion of said printed wiring plate by disposing ends of the conductive paths in a side-by-side relationship;

overlapping said connection area of said printed wiring plate on said connection area of said insulated conductor wiring circuit plate so as to directly contact and electrically connect said ends of said conductors with the ends of the conductive paths, respectively;

forming a plurality of mounting holes disposed at predetermined positions in said printed wiring plate; and providing a plurality of leading electrical wires connected to at least one connector, said connector having connector pins which are inserted into said mounting holes of said branched connection part so as to connect said leading electrical wires to the conducting paths formed on the printed wiring plate.

2. The method according to claim 1, wherein said leading electrical wires are juxtaposed plain electrical wires.

3. The method according to claim 1, wherein the wiring circuit of said insulated conductor wiring circuit plate is formed by conductors which are individually covered with an additional insulation separate from said flexible insulation material and said base insulation film.

* * * * *